United States Patent
Motwani et al.

(10) Patent No.: US 8,959,407 B2
(45) Date of Patent: Feb. 17, 2015

(54) SCALING FACTORS FOR HARD DECISION READS OF CODEWORDS DISTRIBUTED ACROSS DIE

(71) Applicant: Intel Corporation, Santa Clara, CA (US)

(72) Inventors: Ravi H. Motwani, San Diego, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 13/687,951

(22) Filed: Nov. 28, 2012

(65) Prior Publication Data

US 2014/0149825 A1   May 29, 2014

(51) Int. Cl.
| | |
|---|---|
| G06F 11/00 | (2006.01) |
| H03M 13/13 | (2006.01) |
| H03M 13/37 | (2006.01) |
| H03M 13/00 | (2006.01) |
| G06F 11/10 | (2006.01) |
| H03M 13/11 | (2006.01) |
| H03M 13/29 | (2006.01) |

(52) U.S. Cl.
CPC .......... *H03M 13/13* (2013.01); *H03M 13/3723* (2013.01); *H03M 13/3746* (2013.01); *H03M 13/612* (2013.01); *H03M 13/6337* (2013.01); *G06F 11/1012* (2013.01); *H03M 13/1102* (2013.01); *H03M 13/29* (2013.01); *H03M 13/2957* (2013.01)
USPC .......................... 714/704; 714/752; 714/764

(58) Field of Classification Search
CPC .................... G06F 11/1076; G06F 11/1008
USPC ......... 714/764, 773, 752, 758, 763, 755, 780, 714/782, 776
See application file for complete search history.

(56) References Cited

U.S. PATENT DOCUMENTS

| 7,995,678 B2 * | 8/2011 | Norris et al. ............... 375/330 |
| 2006/0072508 A1 * | 4/2006 | Zou et al. ................... 370/332 |
| 2012/0114030 A1 * | 5/2012 | Yue et al. .................... 375/227 |

* cited by examiner

*Primary Examiner* — Fritz Alphonse
(74) *Attorney, Agent, or Firm* — Schwabe, Williamson & Wyatt, P.C.

(57) ABSTRACT

Embodiments include methods, apparatuses, and instructions for encoding a codeword of data as codeword portions stored across multiple die in a non-volatile memory. Embodiments further include a decoder which may be configured to decode the portions of the codeword using hard decision reads. The decoder may then be configured to estimate the quality of each die, and apply a scaling factor to the decoded codeword portions such that confidence or reliability information can be determined for the codeword.

26 Claims, 3 Drawing Sheets

SCALING FACTORS FOR HARD DECISION READS OF CODEWORDS DISTRIBUTED ACROSS DIE

FIELD

Embodiments of the present invention relate generally to the technical field of memory. Specific embodiments describe methods of reading information distributed across multiple die of memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Various error correction solutions have been proposed for non-volatile memory, such as non-volatile memory used in solid state drives (SSDs). Some solutions, for example solutions using hard decision reads of the data, may be performed relatively quickly by a processor. However, certain decoding solutions such as low density parity check (LDPC) based solutions may be used in systems that require additional data which hard decision reads are unable to provide. Soft decision reads of the data may be performed to provide the additional data, however soft decision reads may be relatively slow and incompatible with certain memory technologies.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
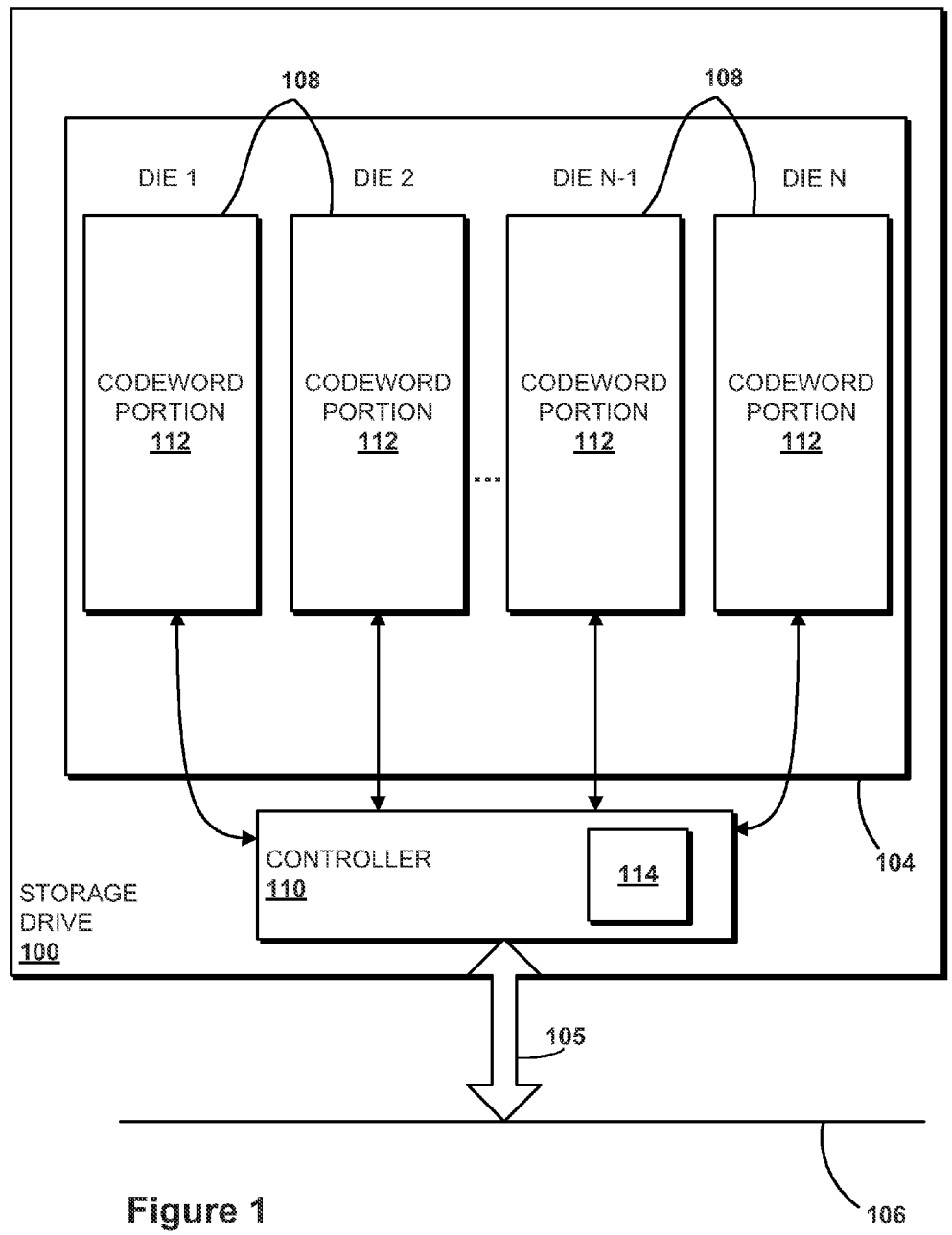
FIG. 1 illustrates an exemplary configuration of multiple die, in accordance with various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Apparatuses and methods are described herein for storing and retrieving data by encoding and subsequently decoding a codeword as codeword portions across multiple die in a non-volatile memory. In certain embodiments, the codeword may be a LDPC codeword, a turbo-code codeword, or some other form of codeword. In certain embodiments, the codeword may include data and check bits. In some embodiments, the codeword portions may be read from the die by performing hard decision reads. After the portions of the codeword are read, scaling factors may be applied to the portions of the codeword that are read from the multiple die. In some embodiments, the scaling factor applied to a portion of the codeword read from a die may be related to the raw bit error rate (RBER) of that die. In certain embodiments, the scaling factor for a die may be inversely proportional to the RBER of the die. By applying the scaling factors to the portions of the codeword, information generally associated with soft decision reads such as reliability information or confidence information may be recovered for the codeword.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet, laptop computer, a set-top box, a gaming console, and so forth.

With reference to FIG. 1, in various embodiments, a storage drive 100 may include non-volatile memory 104. Data may be written to and/or read from non-volatile memory 104 by a controller 110, e.g., by way of one or more communication lines 106 (e.g., one or more buses such as a Serial ATA, or SATA bus). Although not depicted, various other components may be coupled with storage drive 100 via one or more communication lines 106, including but not limited to one or more central processing units (CPUs), volatile memory (e.g., dynamic random access memory, or DRAM), one or more input/output (I/O) devices, alternative processing units (e.g., graphics processors), and so forth. In various embodiments, storage drive 100 may be a solid state drive (SSD) or hybrid hard drive (HHD).

Non-volatile memory 104 may come in various forms, including but not limited to NAND (flash) memory, ferroelectric random-access memory (FeTRAM), nanowire-based non-volatile memory, memory that incorporates memristor technology, MRAM, STT-MRAM, three dimensional (3D) cross point memory such as phase change memory (PCM), and so forth. In many cases, including the example of FIG. 1, non-volatile memory 104 may include a plurality of die 108. For example, in FIG. 1, non-volatile memory 104 includes N die 108. N may be any positive integer.

In various embodiments, error correcting codes may be used with original data stored in non-volatile memory 104 to protect the original data from raw bit errors. For example, the data may be encoded, e.g., by controller 110, into a "codeword." Various encoding schemes may be employed. For example, in various embodiments, concatenated coding, turbo coding, and/or LDPC coding may be employed. In various embodiments, controller 110 may be any combination of hardware and software, and may be separate from storage drive 100, e.g., as an independent component, e.g., on a printed circuit board ("PCB," not shown).

In various embodiments, a codeword may include the original data plus parity data appended to the end. However, the form of the codeword is not material, and in other embodiments, codewords may take other forms. In general, the larger the codeword, the higher resilience non-volatile memory 104 may have to bit errors. Accordingly, in various embodiments, particularly those in which the non-volatile memory is 3D cross point memory, for example PCM, controller 110 may be configured to store respective portions 112 of the codeword in a distributed manner across plurality of die 108. In some embodiments, a first block 114 (e.g., a control block) of controller 110 may be configured to perform these operations.

In various embodiments, controller 110, and in some cases first block 114, may be configured to decode the codeword, e.g., after the codeword is read from non-volatile memory 104. Various types of decoding schemes may be employed by controller 110 and/or first block 114, including but not limited to iterative decoding schemes such as LDPC, concatenated schemes, turbo codes, and so forth. Many such decoding schemes may be capable of detecting and correcting at least some errors.

Some solutions, for example solutions using hard decision reads of the data, may be performed relatively quickly by a processor because they may involve performing only a single read of the data. However, certain decoding solutions such as low density parity check (LDPC) based solutions may be used in systems that require additional data such as confidence data which hard decision reads are unable to provide. Soft decision reads of the data may be performed to provide the additional data, for example confidence intervals, because each piece of data may be read multiple times at a plurality of read reference voltages. However soft decision reads may be relatively slow and incompatible with certain memory technologies such as memresistors or spin transfer torque magnetoresistive random-access memory (STT MRAM)

Figure 2:
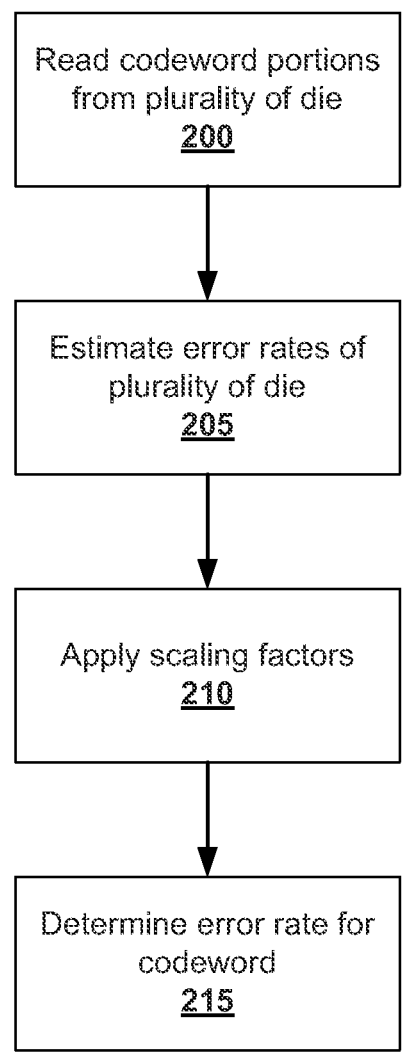
FIG. 2 illustrates an exemplary flow chart for reading a codeword distributed across multiple die, in accordance with various embodiments.

FIG. 2 depicts one embodiment of a method of decoding a codeword, for example the codeword stored as codeword portions 112 in FIG. 1. In certain embodiments the method may be performed by controller 110, though in other embodiments the method may be performed by software, hardware, or firmware elements that are separate from, but communicatively coupled with, the storage drive 100. For the purposes of this example, the method will be discussed with respect to 4 die. The codeword portion 112 on each of the die may be 256 Bytes, for a total codeword size of 1 KB. It will be recognized, however, that in other embodiments the codeword may be a different size. Additionally, the codeword portions 112 may be spread across a greater or less number of die in different embodiments. In certain embodiments the codeword portion 112 may not be uniform, i.e. the same number of bits or bytes, across each of the plurality of die 108. With respect to this example, it will be understood that the phrase "each" of the die or plurality of die is meant to refer to each of the die discussed in the example. However, the storage drive 100 may be configured to have additional die that are not storing codeword portions 112, or that are storing codeword portions 112 for additional codewords.

Initially, the codeword portions 112 may be read from each of the plurality of die 108 at 200. As described above, the codeword portions 112 may be portions of an LDPC codeword, turbo codes, or some other type of codeword. In certain embodiments, the codeword is read via a hard decision read.

The RBERs of each of the die 108 may then be estimated at 205. As discussed above, the estimation may be performed by controller 110 in some embodiments. Alternatively, other hardware, software, or firmware communicatively coupled with the storage drive 100 may perform the estimation in other embodiments. The RBER may be estimated based on the number of bits on the die 108 that are decoded with errors compared to the total number of decoded bits of the die 108. The estimation of the RBER may be accomplished in a variety of ways.

In certain embodiments, a die 108 may comprise several blocks of memory, each block of memory comprising several pages of memory. For example, in one embodiment a die 108 may comprise 2048 blocks of memory, and each block of memory may comprise 256 pages of memory. Each page of memory may hold 16 KB of data. It will be recognized, however, that a die 108 may be divided into different increments, and the number of blocks, pages, or data per page may each be greater or smaller in different embodiments. In these embodiments an RBER of each page of the die 108 may be calculated, and then the RBERs of each die 108 may be combined according to a mean, an average, a median, or some other mathematical method.

For example, a second method for determining the RBER of a die 108 may involve logging the error counts in a firmware engine of the system. The error counts may not be logged at a die-level resolution, but instead may be at the resolution of the non-volatile memory 104 or some other resolution. Therefore, the logging of the error count may not be highly accurate, but may still be useful to give an initial estimation of the RBER of a die 108.

A third method for determining the RBER of a die 108 may extend the first method, described above. When decoding the codeword portion 112 stored on a die 108, a decoder may use the initial estimation of the RBER, discussed above. If there is a failure in decoding the codeword portion 112, then the decoder may retry to decode the codeword portion 112. When the decoder retries to decode the codeword, the decoder may use the output of the original decode attempt to estimate the RBER of the die 108. Although an unsuccessful decode attempt may not provide a valid codeword, the unsuccessful decode attempt may still provide an accurate count of the decode errors, and therefore the RBER, of the die 108.

After the codeword portion 112 on each die 108 is decoded at 200, and the RBER of each die 108 is estimated at 205, the quality of each die 108 may be estimated, for example by controller 110 or some other hardware, software, or firmware component communicatively coupled with storage drive 100. The estimation may be performed by using a scaling factor for the log-likelihood-ratio (LLR) of the bits read out from decoding the codeword portion 112 stored on each die 108 at 210. In some embodiments, the scaling factor for a die 108 may be inverse to the RBER of the die 108 such that the scaling factor is relatively high for a die 108 with a low RBER, and relatively low for a die 108 with a high RBER.

In some embodiments, the LLR may be modeled according to an additive white Gaussian noise (AWGN) channel model. The AWGN channel model may be based on the following equation: $LLR(r)=2/\sigma^2 r$ (Equation 1) where $\sigma^2$ represents the scaling factor for a given die 108, and r represents a factor related to the codeword portion read from the die 108 at 200.

After the scaling factors are applied at 210, then the error rate for the codeword may be determined at 215, for example by controller 110 or some other hardware, software, or firmware component. For example, the application of the scaling factors at 210 may provide an LLR for each die 108 such that a die with a worse RBER has a higher scaling factor, and therefore a lower LLR than a die with a better RBER. The LLR information may then be used to determine the overall error rate for the codeword. The LLRs may be combined in multiple ways including determining an average LLR, a mean LLR, an additive or multiplicative translation, or any other way that will be known to those skilled in the art.

By determining the error rate for the codeword at 215, reliability information which is normally generated through a soft decision read may be obtained, even if the decoder only decodes the codeword portions 112 from the die 108 using a hard decision read. It will be recognized that the ability to generate information normally obtained only through hard decision reads offers significant performance and speed benefits.

Figure 3:
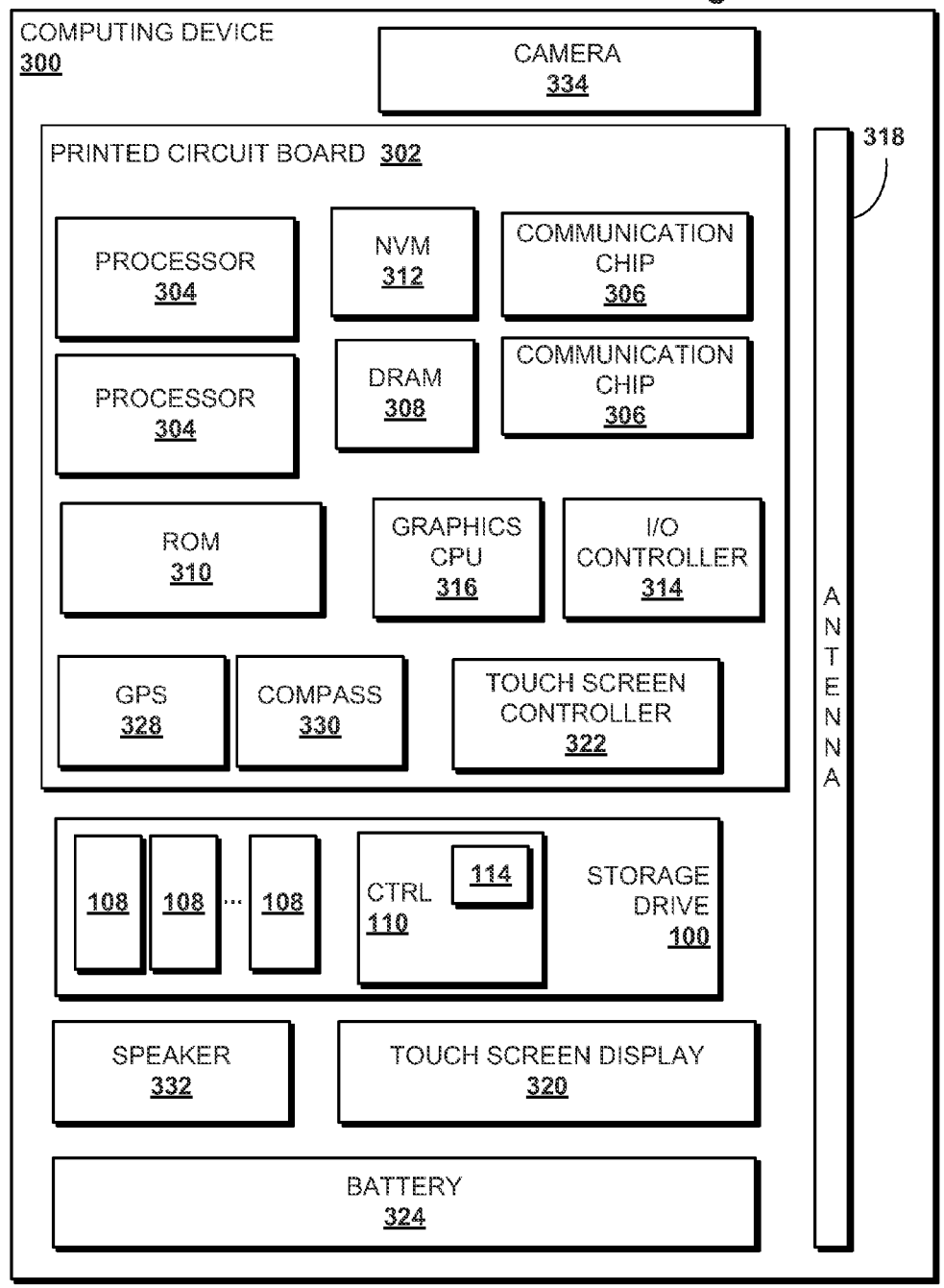
FIG. 3 illustrates an exemplary system configured to perform the methods described herein, in accordance with various embodiments.

FIG. 3 illustrates an example computing device 300 in which systems such as storage drive 100 may be incorporated, in accordance with various embodiments. As discussed above with reference to FIG. 2, the method of FIG. 2 may be performed by controller 110, however in other embodiments the method of FIG. 2 may be performed by alternative components such as hardware, software, or firmware components which are communicatively coupled with storage drive 100. Computing device 300 may include one or more of the alternative components such as one or more processor(s) 304. Computing device 300 may additionally include at least one communication chip 306. In various embodiments, the one or more processor(s) 304 each may include one or more processor cores. In various embodiments, the at least one communication chip 306 may be physically and electrically coupled to the one or more processor(s) 304. In further implementations, the communication chip 306 may be part of the one or more processor(s) 304. In various embodiments, computing device 300 may include PCB 302. For these embodiments, the one or more processor(s) 304 and communication chip 306 may be disposed thereon. In alternate embodiments, the various components may be coupled without the employment of PCB 302.

Depending on its applications, computing device 300 may include other components that may or may not be physically and electrically coupled to the PCB 302. These other components include, but are not limited to, volatile memory (e.g., DRAM 308), non-volatile memory such as read only memory 310 ("ROM") and storage drive 100 (which may include die 108, controller 110, and/or first block 114 as described earlier), an 110 controller 314, a digital signal processor (not shown), a crypto processor (not shown), a graphics processor 316, one or more antenna 318, a display (not shown), a touch screen display 320, a touch screen controller 322, a battery 324, an audio codec (not shown), a video codec (not shown), a global positioning system ("GPS") device 328, a compass 330, an accelerometer (not shown), a gyroscope (not shown), a speaker 332, a camera 334, and a mass storage device (such as hard disk drive, a solid state drive, compact disk ("CD"), digital versatile disk ("DVD")) (not shown), and so forth. In various embodiments, the processor 304 may be integrated on the same die with other components to form a System on Chip ("SoC").

In various embodiments, rather than or in addition to storage drive 100, computing device 300 may include resident non-volatile memory 312, e.g., flash memory, 3D cross point memory, for example PCM, or some other form of non-volatile memory. In some embodiments, the one or more processor(s) 304 and/or non-volatile memory 312 may include associated firmware (not shown) storing programming instructions configured to enable computing device 300, in response to execution of the programming instructions by one or more processor(s) 304 to practice all or selected aspects of method 200. In various embodiments, these aspects may additionally or alternatively be implemented using hardware separate from the one or more processor(s) 304 or non-volatile memory 312.

The communication chips 306 may enable wired and/or wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to IEEE 702.20, General Packet Radio Service ("GPRS"), Evolution Data Optimized ("Ev-DO"), Evolved High Speed Packet Access ("HSPA+"), Evolved High Speed Downlink Packet Access ("HSDPA+"), Evolved High Speed Uplink Packet Access ("HSUPA+"), Global System for Mobile Communications ("GSM"), Enhanced Data rates for GSM Evolution ("EDGE"), Code Division Multiple Access ("CDMA"), Time Division Multiple Access ("TDMA"), Digital Enhanced Cordless Telecommunications ("DECT"), Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

In various implementations, the computing device 300 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 300 may be any other electronic device that processes data.

Embodiments of apparatuses, systems, computer readable media and methods are provided herein. In some embodiments, an apparatus may comprise an encoder configured to generate a codeword for a data for storing the data in a non-volatile memory by storing the codeword in the non-volatile memory. The codeword may include the data and a plurality of check bits. The non-volatile memory may include a plurality of die. Storing the codeword may include respectively storing a plurality of portions of the codeword in the plurality of die. The apparatus may further comprise a decoder configured to recover the data from a read back of the codeword. The read back may include respective hard decision reads of the different portions of the codeword. Recovery of the data may include application of differential scaling factors to the hard decision reads based at least in part on respective estimated RBERs of the plurality of die.

In some embodiments, the codeword may be a LDPC codeword. In other embodiments the non-volatile memory may be a 3D cross point memory. In some embodiments, the decoder may be further configured to apply the differential scaling factors to respective LLRs of the hard decision reads of the different portions of the codeword. In some embodiments, a lower differential scaling factor may be applied to a hard decision read of a die with a higher estimated RBER, and a higher scaling factor may be applied to a hard decision read of a die with a lower estimated RBER. In certain embodiments, the estimated RBER of a die may be estimated based at least in part on a log of a failed first decode attempt of the codeword. In certain embodiments the apparatus may be a computing device including a microprocessor which comprises a controller having the encoder and the decoder, and a number of processor cores coupled with the controller. The computing device may further comprise a solid state drive coupled with the microprocessor, the solid state drive comprising the non-volatile memory. The computing device may further include a graphics processor coupled with the microprocessor. In some embodiments, the apparatus may be a PDA, a smartphone, a computing tablet, an e-reader, an ultrabook, a laptop computer, a desktop computer, a server, a set-top box, or a game console.

Other embodiments include a computer readable media comprising instructions configured to cause an apparatus, in response to execution of the instructions by the apparatus, to generate a codeword for a data for storing the data in a non-volatile memory by storing the codeword in the non-volatile memory. The codeword may include the data and a plurality of check bits, and the non-volatile memory may include a plurality of die. Storing the codeword may include respectively storing a plurality of portions of the codeword in the plurality of die. The instructions may further cause the apparatus to recover the data from the codeword via hard decision reads of the plurality of portions of the codeword from the plurality of die, estimate respective RBERs of the plurality of die, and apply respective different scaling factors to the data based at least in part on the RBERs of the plurality of die. The apparatus may be a computing device including a microprocessor comprising a controller having an encoder and a decoder, and a number of processor cores coupled with the controller. The computing device may further include a solid state drive coupled with the microprocessor, the solid state drive comprising a non-volatile memory, and a battery coupled with the controller.

Other embodiments may include a method comprising reading hard decision data of a codeword stored in a plurality of die of a non-volatile memory, the codeword comprising data and a plurality of check bits, wherein hard decision data of a die in the plurality of die relates to a portion of the codeword. The method may then comprise applying respective differential scaling factors to the hard decision data based at least in part on respective estimated RBERs of the multiple die.

Yet other embodiments include a system comprising a processor, a battery, and a storage drive. The storage drive may comprise a non-volatile memory include a plurality of die. The storage drive may further comprise an encoder configured to generate a codeword for a data and store the data in the non-volatile memory by storing the codeword in the non-volatile memory, wherein the codeword includes the data and a plurality of check bits. Storing the codeword may include respectively storing a plurality of portions of the codeword in the plurality of die. The storage drive may further comprise a decoder configured to recover the data from a read back of the codeword, wherein the read back of the codeword includes respective hard decision reads of the different portions of the codeword. The recover of the data may include application of differential scaling factors to the hard decision reads based at least in part on respective estimated RBERs of the plurality of die.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
   an encoder configured to generate a codeword for a data for storing the data in a non-volatile memory by storing the codeword in the non-volatile memory, wherein the codeword includes the data and a plurality of check bits, and the non-volatile memory includes a plurality of die, and wherein storing the codeword includes respectively storing a plurality of portions of the codeword in the plurality of die; and
   a decoder configured to recover the data from a read back of the codeword, wherein the read back of the codeword includes respective hard decision reads of the different portions of the codeword, and wherein recovery of the data includes application of differential scaling factors to the hard decision reads based at least in part on respective estimated raw bit error rates (RBERs) of the plurality of die.

2. The apparatus of claim 1, wherein the codeword is a low density parity check (LDPC) codeword.

3. The apparatus of claim 1, wherein the non-volatile memory is a three dimensional (3D) cross point memory.

4. The apparatus of claim 1, wherein the decoder is further configured to apply the differential scaling factors to respective log-likelihood ratios (LLRs) of the hard decision reads of the different portions of the codeword.

5. The apparatus of claim 1, wherein a lower differential scaling factor in the differential scaling factors is applied to a hard decision read in the hard decision reads of a die in the multiple die with a higher estimated RBER, and a higher differential scaling factor in the differential scaling factors is applied to a hard decision read in the hard decision reads of a die in the multiple die with a lower estimated RBER.

6. The apparatus of claim 1, wherein an estimated RBER of a die in the multiple die is estimated based at least in part on a log of a failed first decode attempt of the codeword.

7. The apparatus of claim 1, wherein the apparatus is a computing device including a microprocessor comprising a controller having the encoder and the decoder, and a number of processor cores coupled with the controller;
   a solid state drive coupled with the microprocessor, the solid state drive comprising the non-volatile memory; and
   a graphics processor coupled with the microprocessor.

8. The apparatus of claim 7, wherein the apparatus is a personal digital assistant (PDA), a smartphone, a computing tablet, an e-reader, an ultrabook, a laptop computer, a desktop computer, a server, a set-top box, or a game console.

9. One or more non-transitory computer readable media comprising instructions configured to cause an apparatus, in response to execution of the instructions by the apparatus, to:
generate a codeword for a data for storing the data in a non-volatile memory by storing the codeword in the non-volatile memory, wherein the codeword includes the data and a plurality of check bits, and the non-volatile memory includes a plurality of die, and wherein storing the codeword includes respectively storing a plurality of portions of the codeword in the plurality of die;
recover the data from the codeword via hard decision reads of the plurality of portions of the codeword from the plurality of die;
estimate respective raw bit error rates (RBERs) of the plurality of die; and
apply respective differential scaling factors to the data based at least in part on the RBERs of the plurality of die.

10. The one or more computer readable media of claim 9, wherein the codeword is a low density parity check (LDPC) codeword.

11. The one or more computer readable media of claim 9, wherein the instructions are further configured to cause the apparatus, in response to execution of the instructions by the apparatus, to apply the differential scaling factors to respective log-likelihood-ratios (LLRs) of the hard decision reads of the plurality of portions of the codeword.

12. The one or more computer readable media of claim 9, wherein a magnitude of a differential scaling factor applied to data recovered by a hard decision read of a portion of the codeword in the plurality of portions of the codeword stored on a die in the plurality of die is inversely proportional to an RBER of the die.

13. The one or more computer readable media of claim 9, wherein an RBER of a die in the plurality of die is estimated based at least in part on a log of a failed decode attempt of the portion of the codeword stored on the die.

14. The one or more computer readable media of claim 9, wherein the apparatus is a computing device including a microprocessor comprising a controller having an encoder and a decoder, and a number of processor cores coupled with the controller;
a solid state drive coupled with the microprocessor, the solid state drive comprising the non-volatile memory; and
a battery coupled with the controller.

15. A method comprising:
reading hard decision data of a codeword stored in a plurality of die of a non-volatile memory, the codeword comprising data and a plurality of check bits, wherein hard decision data of a die in the plurality of die relates to a portion of the codeword;
applying respective differential scaling factors to the hard decision data based at least in part on respective estimated raw bit error rates (RBERs) of the multiple die.

16. The method of claim 15, wherein the codeword is a low density parity check (LDPC) codeword.

17. The method of claim 15, wherein applying respective differential scaling factors comprises applying a differential scaling factor in the differential scaling factors to a log-likelihood ratio (LLR) of the hard decision data of a codeword stored in a die in the plurality of die.

18. The method of claim 17, wherein a magnitude of a differential scaling factor applied to the LLR of the die is inversely proportional to an RBER of the die.

19. The method of claim 15, further comprising estimating an RBER of a die in the plurality of die based at least in part on a log of error counts of a failed decode attempt of the portion of the codeword stored on the die.

20. The method of claim 15, further comprising calculating a confidence interval based at least in part on applying the respective differential scaling factors to the hard decision data.

21. A system comprising:
a processor;
a battery; and
a storage drive coupled with the processor, the storage drive comprising:
a non-volatile memory including a plurality of die;
an encoder configured to generate a codeword for a data and store the data in the non-volatile memory by storing the codeword in the non-volatile memory, wherein the codeword includes the data and a plurality of check bits, wherein storing the codeword includes respectively storing a plurality of portions of the codeword in the plurality of die; and
a decoder configured to recover the data from a read back of the codeword, wherein the read back of the codeword includes respective hard decision reads of the different portions of the codeword, and wherein recovery of the data includes application of differential scaling factors to the hard decision reads based at least in part on respective estimated raw bit error rates (RBERs) of the plurality of die.

22. The system of claim 21, wherein the codeword is a low density parity check (LDPC) codeword.

23. The system of claim 21, wherein the non-volatile memory is a three dimensional (3D) cross point memory.

24. The system of claim 21, wherein the decoder is further configured to apply the differential scaling factors to respective log-likelihood ratios (LLRs) of the hard decision reads.

25. The system of claim 21, wherein a lower differential scaling factor in the differential scaling factors is applied to a hard decision read in the hard decision reads of a die in the multiple die with a higher estimated RBER, and a higher differential scaling factor in the differential scaling factors is applied to a hard decision read in the hard decision reads of a die in the multiple die with a lower estimated RBER.

26. The system of claim 21, wherein an estimated RBER of a die in the multiple die is estimated based at least in part on a log of a failed first decode attempt of the codeword.

* * * * *